US012200878B2

United States Patent
Jung et al.

(10) Patent No.: US 12,200,878 B2
(45) Date of Patent: Jan. 14, 2025

(54) ELECTRONIC DEVICE INCLUDING AIR VENT

(71) Applicant: Samsung Electronics Co., Ltd., Gyeonggi-do (KR)

(72) Inventors: Yanggyun Jung, Gyeonggi-do (KR); Hosung Bang, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 390 days.

(21) Appl. No.: 17/532,000

(22) Filed: Nov. 22, 2021

(65) Prior Publication Data

US 2022/0174827 A1 Jun. 2, 2022

Related U.S. Application Data

(63) Continuation of application No. PCT/KR2021/016402, filed on Nov. 11, 2021.

(30) Foreign Application Priority Data

Dec. 2, 2020 (KR) ........................ 10-2020-0166215

(51) Int. Cl.
*H05K 5/02* (2006.01)
*H04M 1/02* (2006.01)
*H04M 1/03* (2006.01)

(52) U.S. Cl.
CPC ........ *H05K 5/0213* (2013.01); *H04M 1/0264* (2013.01); *H04M 1/03* (2013.01)

(58) Field of Classification Search
CPC .................................................. H05K 5/0213
See application file for complete search history.

(56) References Cited

U.S. PATENT DOCUMENTS

| 10,148,800 | B1 | 12/2018 | Frederickson et al. |
| 10,389,007 | B1 | 8/2019 | Choi et al. |
| 10,819,836 | B2 | 10/2020 | Lim et al. |
| 2014/0078708 | A1* | 3/2014 | Song .................. H04N 1/00307 361/809 |
| 2017/0251564 | A1 | 8/2017 | Jun et al. |
| 2017/0280558 | A1* | 9/2017 | Ohara .................... G03B 17/55 |

(Continued)

FOREIGN PATENT DOCUMENTS

| CN | 110365820 A | 10/2019 |
| JP | 2012-186549 A | 9/2012 |
| JP | 2017-117895 A | 6/2017 |

(Continued)

OTHER PUBLICATIONS

European Search Report dated Dec. 6, 2023.
International Search Report dated Feb. 18, 2022.
Korean Office Action dated Sep. 26, 2024.

*Primary Examiner* — Hsinchun Liao
(74) *Attorney, Agent, or Firm* — Cha & Reiter, LLC

(57) ABSTRACT

According to certain embodiments, an electronic device comprises a housing including an opening facing an outside of the electronic device and a cavity spaced apart from the opening; a display disposed on the housing; an air vent disposed between the housing and the display and at least partially facing the opening; and a camera module disposed in the housing and at least partially facing the cavity, wherein the cavity, the air vent and the opening are configured to provide an air path.

18 Claims, 10 Drawing Sheets

(56) References Cited

U.S. PATENT DOCUMENTS

2018/0035204 A1    2/2018   Park et al.
2019/0098121 A1    3/2019   Jeon et al.

FOREIGN PATENT DOCUMENTS

| KR | 10-2017-0098122 A | 8/2017 |
| KR | 10-2017-0100368 A | 9/2017 |
| KR | 10-2018-0013613 A | 2/2018 |
| KR | 10-2018-0020653 A | 2/2018 |
| KR | 10-2019-0034063 A | 4/2019 |
| KR | 10-2019-0076658 A | 7/2019 |
| KR | 10-2019-0121119 A | 10/2019 |
| KR | 10-2019-0140209 A | 12/2019 |
| KR | 10-2020-0101240 A | 8/2020 |
| WO | 2020/171498 A1 | 8/2020 |

\* cited by examiner

ELECTRONIC DEVICE INCLUDING AIR VENT

CROSS-REFERENCE TO RELATED APPLICATION(S)

This application is a continuation application, claiming priority under § 365(c), of an International application No. PCT/KR2021/016402, filed on Nov. 11, 2021, which was based on and claimed the benefit of an Korean patent application Serial number 10-2020-0166215, filed on Dec. 2, 2020 in the Korean Intellectual Property Office, the disclosures of each of which is incorporated by reference herein in its entirety.

BACKGROUND

1) Field

Certain embodiments of the disclosure relate to an electronic device including an air vent.

2) Description of Related Art

Advancing radio and semiconductor technologies accelerate the spread and use of various electronic devices. In particular, recent electronic devices are being developed to carry out communication while carried on.

The term "electronic device" may mean a device performing a particular function according to its equipped program, such as a home appliance, an electronic scheduler, a portable multimedia player, a mobile communication terminal, a tablet PC, a video/sound device, a desktop PC or laptop computer, a navigation for automobile, etc. For example, electronic devices may output stored information as voices or images. As electronic devices are highly integrated, and high-speed, high-volume wireless communication becomes commonplace, an electronic device, such as a mobile communication terminal, is recently being equipped with various functions. For example, an electronic device comes with various integrated functions, including an entertainment function, such as playing video games, a multimedia function, such as replaying music/videos, a communication and security function for mobile banking, and a scheduling or e-wallet function. Such electronic devices become compact enough for users to carry in a convenient way.

It is desirable for electronic devices to be portable so that the user can carry them on their person while moving about. However, with portability comes the likelihood that the electronic device will be subjected to a number of different environments, including environments where the electronic device is exposed to water. Since water can short electrical circuits, it can be desirable to make the electronic device waterproof.

For waterproofing, an electronic device (e.g., a portable terminal) includes a sealed structure that blocks a path through which moisture may be introduced. However, the sealed structure also prevents the flow of air between the outside and the inside of the electronic device. As a result, a pressure difference between the outside and the inside of the electronic device may increase. When the pressure difference between the outside and the inside of the electronic device exceeds certain levels, fogging or dew condensation on the camera window may occur. Additionally, the performance of the atmospheric sensor or the speaker may deteriorate.

Electronic devices using a gap to equalize the air pressure while providing a sealed structure would have a gap between the rear plate and the camera decoration part. Air flow may require a camera flange positioned between the camera decoration part and the rear plate, causing an increase in the volume of the electronic device or a decrease in the mounting space. The structure using the gap formed between the camera window and the camera decoration member as an air movement path may have an insufficient air flow amount to equalize the air pressure.

SUMMARY

According to certain embodiments, an electronic device comprises a housing including an opening facing an outside of the electronic device and a cavity spaced apart from the opening; a display disposed on the housing; an air vent disposed between the housing and the display and at least partially facing the opening; and a camera module disposed in the housing and at least partially facing the cavity, wherein the cavity, the air vent and the opening are configured to provide an air path.

According to certain embodiments of the disclosure, an electronic device may comprise a housing including a first supporting member including a opening facing an outside of the electronic device and a cavity spaced apart from the opening and a rear plate connected with the first supporting member and including a second opening, a display disposed on the first supporting member, an air vent disposed between the first supporting member and the display and at least partially facing the opening, and a camera module disposed in the housing, facing the cavity, and at least partially exposed to the outside of the electronic device through the second opening.

According to certain embodiments, an electronic device comprises: a housing having an opening, wherein the opening extending from outside the electronic device to the inside of the electronic device; an air vent in the housing receiving at least a portion of the opening on the inside of the electronic device; a waterproofing member in the housing connecting a display to the housing, the waterproofing member at least partially surrounding the air vent; a cavity in the housing spaced apart from the opening, the cavity received by the air vent; a camera module in the housing, and wherein the cavity forms portion of an airway from the camera module to the opening.

The disclosure is not limited to the foregoing embodiments but various modifications or changes may rather be made thereto without departing from the spirit and scope of the disclosure.

DETAILED DESCRIPTION

According to certain embodiments of the disclosure, there may be provided an electronic device capable of controlling external and internal pressures of the electronic device using an opening formed in the housing and an air vent corresponding to the opening.

According to certain embodiments of the disclosure, the electronic device may reduce the difference in pressure between the inside and outside of the electronic device using the opening formed in the housing and the air vent corresponding to the opening. By reducing the difference in pressure between the inside and outside of the electronic device, it is possible to reduce fogging on the camera window and to enhance the performance of the atmospheric pressure sensor and speaker.

Certain embodiments described herein provide for an electronic device capable of preventing deterioration of components due to exposure to water, while allowing for equalization of air pressure.

Figure 1:
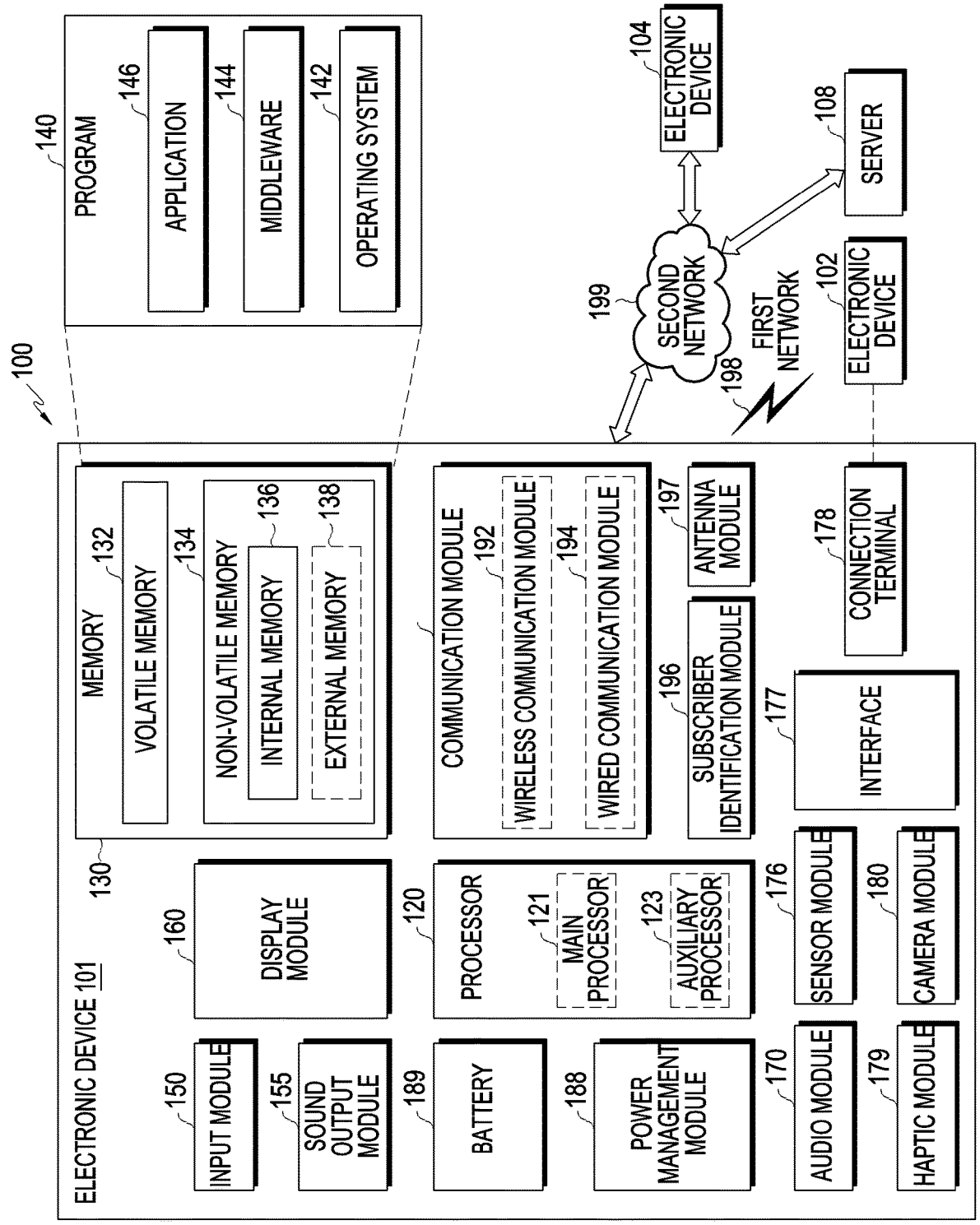
FIG. 1 is a block diagram illustrating an electronic device in a network environment according to certain embodiments of the disclosure.
Figure 2:
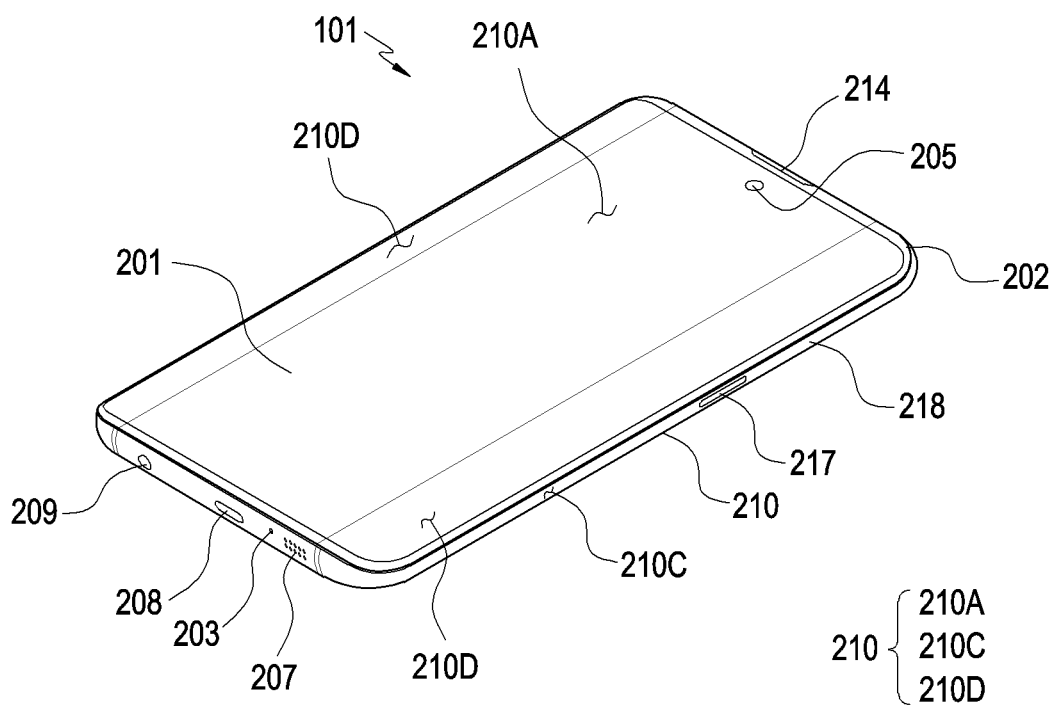
FIG. 2 is a front perspective view illustrating an electronic device according to certain embodiments of the disclosure.
Figure 3:
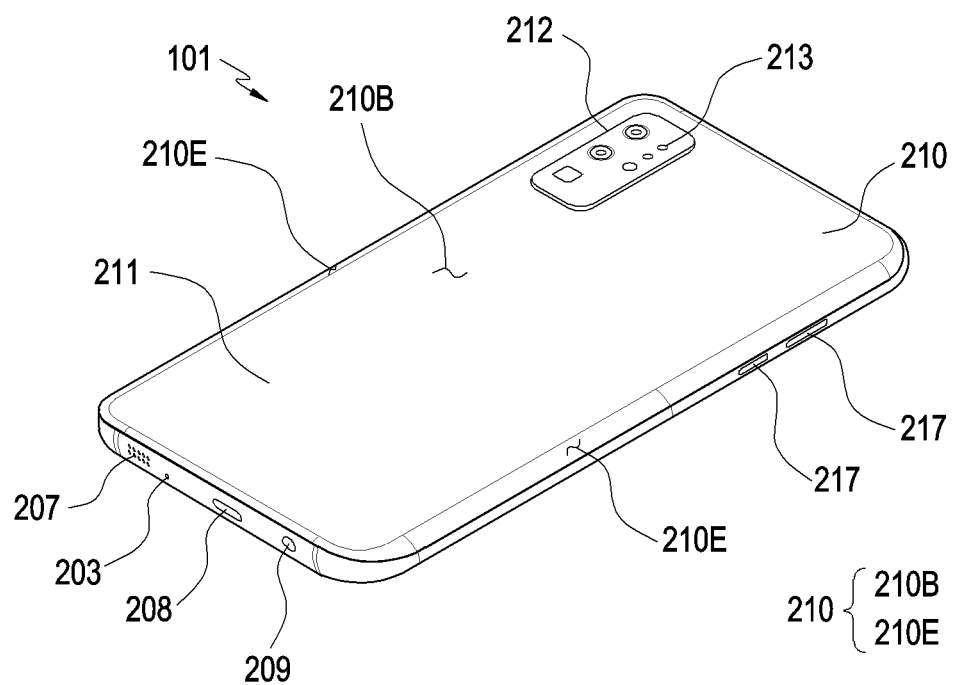
FIG. 3 is a rear perspective view illustrating an electronic device according to certain embodiments of the disclosure.
Figure 4:
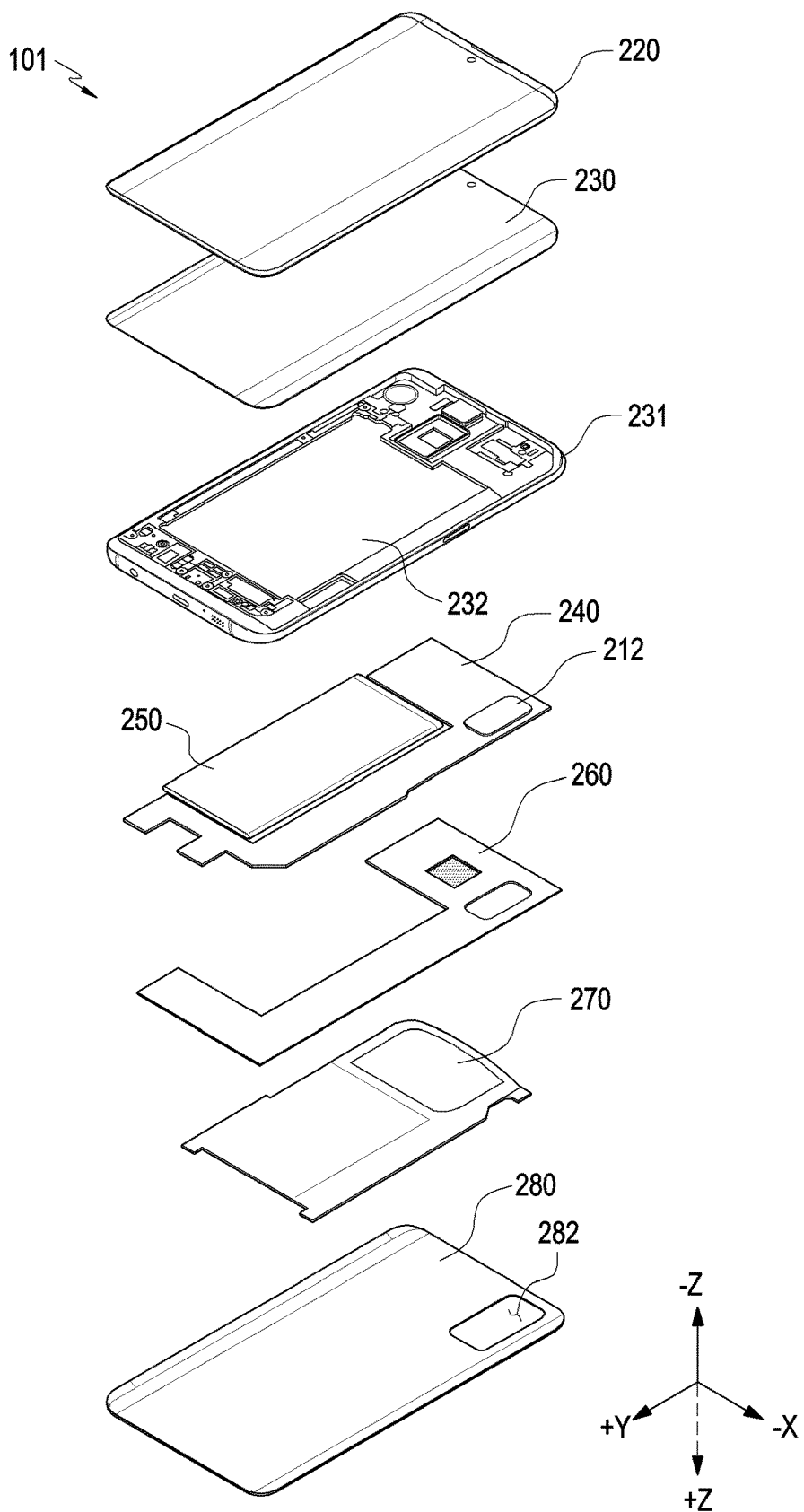
FIG. 4 is an exploded perspective view illustrating an electronic device according to certain embodiments of the disclosure.

FIG. 1-4 describe an electronic device. FIG. 1 describe the electronic device 101 with functional features in a network environment. The electronic device 101 may include a number of electronic components. To protect the electronic components, the electronic device 101 includes a housing 210. FIG. 2 describes the front and FIG. 3 describes the rear. FIG. 4 describes the internal layers as they are disposed within the housing.

The electronic device may be subjected to a number of different environments, including environments where the electronic device is exposed to moisture or water. Moisture and water can short electrical circuits within electronic components. Accordingly, the electronic device 101 includes a housing 210 as described in FIG. 2-4. However, in FIG. 6, the electronic device 101 includes an air gap 312 (e.g., opening) to equalize pressure from inside the electronic device 101 to the outside. The air gap is received by a vent 400. At least a portion of the air vent is surrounded by a waterproofing member. The waterproofing member 600 may connect the display 230 and the housing 300. Accordingly, the electronic device 101 protects from exposure to water and moisture while also allowing sufficient air flow to equalize pressure. The disclosure will begin with a description of the electronic device in FIGS. 1-4.

FIG. 1 described functional features of the electronic device 101. FIG. 2-4 describe the housing.

FIG. 1 is a block diagram illustrating an electronic device in a network environment according to certain embodiments of the disclosure;

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one (e.g., the connecting terminal 178) of the components may be omitted from the electronic device 101, or one or more other components may be added in the electronic device 101. According to an embodiment, some (e.g., the sensor module 176, the camera module 180, or the antenna module 197) of the components may be integrated into a single component (e.g., the display module 160). The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be configured to use lower power than the main processor 121 or to be specified for a designated function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. The artificial intelligence model may be generated via machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by other component (e.g., the processor 120) of the electronic device 101, from the outside (e.g., a user) of the electronic device 101. The input module 150 may include, for example, a microphone, a mouse, a keyboard, keys (e.g., buttons), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display 160 may include a touch sensor configured to detect a touch, or a pressure sensor configured to measure the intensity of a force generated by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via a first network 198 (e.g., a short-range communication network, such as Bluetooth™, wireless-fidelity (Wi-Fi) direct, or infrared data association (IrDA)) or a second network 199 (e.g., a long-range communication network, such as a legacy cellular network, a 5G network, a next-generation communication network, the Internet, or a computer network (e.g., local area network (LAN) or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device). According to an embodiment, the antenna module may include an antenna including a radiator formed of a conductor or conductive pattern formed on a substrate (e.g., a printed circuit board (PCB)). According to an embodiment, the antenna module 197 may include a plurality of antennas (e.g., an antenna array). In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., radio frequency integrated circuit (RFIC)) than the radiator may be further formed as part of the antenna module 197.

According to certain embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. The external electronic devices 102 or 104 each may be a device of the same or a different type from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra-low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or health-care) based on 5G communication technology or IoT-related technology.

The electronic device according to certain embodiments of the disclosure may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above. It should be appreciated that certain embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC). According to certain embodiments, each component (e.g., a module or a program) of the above-described components may include a single entity or multiple entities. Some of the plurality of entities may be separately disposed in different components. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

The electronic device 101 may be subject to a variety of environments, including an environment where the electronic device 101 is exposed to moisture or water. Accordingly, the electronic device 101 includes a housing 210 to prevent exposure to water and moisture. As will be seen in FIG. 6, the housing 210 also allows for air flow to permit equalization of the air pressure.

FIG. 2 is a front perspective view illustrating an electronic device according to certain embodiments of the disclosure; FIG. 3 is a rear perspective view illustrating an electronic device according to certain embodiments of the disclosure;

Referring to FIGS. 2 and 3, an electronic device 101 may include a housing 210 with a front surface 210A, a rear surface 210B, and a side surface 210C surrounding a space between the front surface 210A and the rear surface 210B. The housing 210 also includes an air gap that is received by a vent at least partially surrounded by a waterproofing member as will be described in FIG. 6. At least part of the front surface 210A may have a substantially transparent front plate 202 (e.g., a glass plate or polymer plate including various coat layers). The rear surface 210B may be formed by a rear plate 211. The rear plate 211 may be formed of, e.g., glass, ceramic, polymer, metal (e.g., aluminum, stainless steel (STS), or magnesium), or a combination of at least two thereof. The side surface 210C may be formed by a side bezel structure (or a "side member") 218 that couples to the front plate 202 and the rear plate 211 and includes a metal and/or polymer. According to an embodiment, the rear plate 211 and the side bezel plate 218 may be integrally formed together and include the same material (e.g., glass, metal, such as aluminum, or ceramic).

In the embodiment illustrated, the front plate 202 may include two first edge areas 210D, which seamlessly and bendingly extend from the first surface 210A to the rear plate 211, on both the long edges of the front plate 202. In the embodiment (refer to FIG. 3) illustrated, the rear plate 211 may include two second edge areas 210E, which seamlessly and bendingly extend from the rear surface 210B to the front plate 202, on both the long edges. The front plate 202 (or the rear plate 211) may include only one of the first edge areas 210D (or the second edge areas 210E). According to another embodiment, the first edge areas 210D or the second edge areas 210E may partially be excluded. At side view of the electronic device 101, the side bezel structure 218 may have a first thickness (or width) for sides that do not have the first edge areas 210D or the second edge areas 210E and a second thickness, which is smaller than the first thickness, for sides that have the first edge areas 210D or the second edge areas 210E.

The electronic device 101 may include at least one of a display 201, audio modules 203, 207, and 214 (e.g., the audio module 170 of FIG. 1), a sensor module (e.g., the sensor module of FIG. 1). 176), camera modules 205 and 212 (e.g., the camera module 180 of FIG. 1), a key input device 217 (e.g., the input module 150 of FIG. 1), and connector holes 208 and 209 (e.g., the connection terminal 178 of FIG. 1). The electronic device 101 may exclude at least one (e.g., the connector hole 209) of the components or may add other components.

The display 201 may be visually exposed through, e.g., a majority portion of the front plate 202. At least a portion of the display 201 may be exposed through the front plate 202 forming the front surface 210A and the first edge areas 210D. The edge of the display 201 may be formed to be substantially the same in shape as an adjacent outer edge of the front plate 202. The interval between the outer edge of the display 201 and the outer edge of the front plate 202 may remain substantially even to give a larger area of exposure the display 201.

The surface (or the front plate 202) of the housing 210 may include a screen display area formed as the display 201 is visually exposed. For example, the screen display area may include the front surface 210A and first edge areas 210D.

According to another embodiment (not shown), the electronic device 101 may include a recess or opening formed in a portion of the screen display area (e.g., the front surface 210A or the first edge area 210D) of the display 201 and may include at least one or more of an audio module 214, a sensor module (not shown), a light emitting device (not shown), and a camera module 205 aligned with the recess or opening. At least one or more of the audio module 214, sensor module (not shown), camera module 205, fingerprint sensor (not shown), and light emitting device (not shown) may be included on the rear surface of the screen display area of the display 201.

The display 201 may be disposed to be coupled with, or adjacent, a touch detecting circuit, a pressure sensor capable of measuring the strength (pressure) of touches, and/or a digitizer for detecting a magnetic field-type stylus pen.

In some embodiments, at least a portion of the key input device 217 may be disposed on the side bezel structure 218.

The audio modules 203, 207, and 214 may include, e.g., a microphone hole 203 and speaker holes 207 and 214. The microphone hole 203 may have a microphone inside to obtain external sounds. There may be a plurality of microphones to be able to detect the direction of a sound. The speaker holes 207 and 214 may include an external speaker hole 207 and a phone receiver hole 214. The speaker holes 207 and 214 and the microphone hole 203 may be implemented as a single hole, or speakers may be included without the speaker holes 207 and 214 (e.g., piezo speakers).

The sensor modules (not shown) may generate an electrical signal or data value corresponding to an internal operating state or external environmental state of the electronic device 101. The sensor modules (not shown) may include a first sensor module (not shown) (e.g., a proximity sensor) and/or a second sensor module (not shown) (e.g., a fingerprint sensor) disposed on the front surface 210A of the housing 210 and/or a third sensor module (not shown) (e.g., an HRM sensor) and/or a fourth sensor module (not shown) (e.g., a fingerprint sensor) disposed on the rear surface 210B of the housing 210. In an embodiment (not shown), the fingerprint sensor may be disposed on the rear surface 210B as well as on the front surface 210A (e.g., the display 201) of the housing 210. The electronic device 101 may further include sensor modules not shown, e.g., at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor (not shown).

The camera modules 205 and 212 may include a front camera module 205 disposed on the first surface 210A of the electronic device 101 and a rear camera module 212 and/or a flash 213 disposed on the rear surface 210B. The camera modules 205 and 212 may include one or more lenses, an image sensor, and/or an image signal processor. The flash 213 may include, e.g., a light emitting diode (LED) or a xenon lamp. Two or more lenses (an infrared (IR) camera, a wide-angle lens, and a telescopic lens) and image sensors may be disposed on one surface of the electronic device 101. The electronic device 101 may include a plurality of camera modules (e.g., a dual camera or triple camera) having different attributes (e.g., angle of view) or functions. For example, a plurality of camera modules 205 and 212 including lenses having different angles of view may be configured, and the electronic device 101 may control to change the angle of view of the camera modules 205 and 212 performed by the electronic device 101 based on the user's selection. For example, at least one of the plurality of camera modules 205 and 212 may be a wide-angle camera and at least another of the plurality of camera modules may be a telephoto camera. Similarly, at least one of the plurality of camera modules 205 and 212 may be a front camera and at least another of the plurality of camera modules may be a rear camera. Further, the plurality of camera modules 205 and 212 may include at least one of a wide-angle camera, a telephoto camera, and an infrared (IR) camera (e.g., a time of flight (TOF) camera, a structured light camera). The IR camera may be operated as at least a portion of the sensor module. For example, the TOF camera may be operated as at least a portion of a sensor module (not shown) for detecting the distance to the subject.

The key input device 217 may be disposed on the side surface 210C of the housing 210. The electronic device 101 may exclude all or some of the above-mentioned key input devices 217 and the excluded key input devices 217 may be implemented in other forms, e.g., as soft keys, on the display 201.

The light emitting device (not shown) may be disposed on, e.g., the front surface 210A of the housing 210. The light emitting device (not shown) may provide, e.g., information about the state of the electronic device 101 in the form of light. According to another embodiment, the light emitting device (not shown) may provide a light source that interacts with, e.g., the front camera module 205. The light emitting device (not shown) may include, e.g., a light emitting device (LED), an infrared (IR) LED, and/or a xenon lamp.

The connector holes 208 and 209 may include, e.g., a first connector hole 208 for receiving a connector (e.g., a universal serial bus (USB) connector) for transmitting or receiving power and/or data to/from an external electronic device and/or a second connector hole (e.g., an earphone jack) 209 for receiving a connector for transmitting or receiving audio signals to/from the external electronic device.

The camera module 205 and/or the sensor module (not shown) may be disposed to contact the external environment through a designated area of the display 201 and the front plate 202 from the internal space of the electronic device 101. For example, the designated area may be an area in which pixels are not disposed in the display 201. As another example, the designated area may be an area in which pixels are disposed in the display 201. When viewed from above the display 201, at least a portion of the designated area may overlap the camera module 205 and/or the sensor module. As another example, some sensor modules may be arranged to perform their functions without being visually exposed through the front plate 202 from the internal space of the electronic device.

FIG. 4 is an exploded perspective view illustrating an electronic device according to certain embodiments of the disclosure.

Referring to FIG. 4, an electronic device 101 (e.g., the electronic device 101 of FIGS. 2 to 3) may include at least one of a front plate 220 (e.g., the front plate 202 of FIG. 2), a display 230 (e.g., the display 201 of FIG. 2), a first supporting member 232 (e.g., a bracket), a main printed circuit board 240, a battery 250, a second supporting member 260 (e.g., a rear case), an antenna 270, and a rear plate 280 (e.g., the rear plate 211 of FIG. 3). According to an embodiment, the electronic device 101 may exclude at least one (e.g., the first supporting member 232 or the second supporting member 260) of the components or may add other components. At least one of the components of the electronic device 101 may be the same or similar to at least one of the components of the electronic device 101 of FIG. 2 or 3 and no duplicate description is made below.

The first supporting member 232 may be disposed inside the electronic device 101 to be connected with the side bezel structure 231 or integrated with the side bezel structure 231. The first supporting member 232 may be formed of, e.g., a metallic material and/or non-metallic material (e.g., polymer). The display 230 may be joined onto one surface of the first supporting member 232, and the printed circuit board 240 may be joined onto the opposite surface of the first supporting member 232. A processor, memory, and/or interface may be mounted on the printed circuit board 240. The processor may include one or more of, e.g., a central processing unit, an application processor, a graphic processing device, an image signal processing, a sensor hub processor, or a communication processor.

The memory may include, e.g., a volatile or non-volatile memory.

The interface may include, for example, a high definition multimedia interface (HDMI), a universal serial bus (USB) interface, a secure digital (SD) card interface, and/or an audio interface. The interface may electrically or physically connect, e.g., the electronic device 101 with an external electronic device and may include a USB connector, an SD card/multimedia card (MMC) connector, or an audio connector.

The battery 250 may be a device for supplying power to at least one component (e.g., the camera module 212) of the electronic device 101. The battery 250 may include, e.g., a primary cell which is not rechargeable, a secondary cell which is rechargeable, or a fuel cell. At least a portion of the battery 250 may be disposed on substantially the same plane as the printed circuit board 240. The battery 250 may be integrally or detachably disposed inside the electronic device 101.

The second supporting member 260 (e.g., a rear case) may be disposed between the printed circuit board 240 and the antenna 270. For example, the second supporting member 260 may include one surface to which at least one of the printed circuit board 240 and the battery 250 is coupled, and another surface to which the antenna 270 is coupled.

The antenna 270 may be disposed between the rear plate 280 and the battery 250. The antenna 270 may include, e.g., a near-field communication (NFC) antenna, a wireless charging antenna, and/or a magnetic secure transmission (MST) antenna. The antenna 270 may perform short-range communication with, e.g., an external device or may wirelessly transmit or receive power necessary for charging. For example, the antenna 270 may include a coil for wireless charging. According to an embodiment of the present invention, an antenna structure may be formed by a portion or combination of the side bezel structure 231 and/or the first supporting member 232.

The electronic device 101 may include a camera module 212 disposed in the second housing (e.g., the housing 210 of FIG. 2). The camera module (e.g., the camera module 500 of FIG. 6) may be disposed on the first supporting member 232 and may be a rear camera module (e.g., the camera module 212 of FIG. 3) capable of obtaining an image of a subject positioned behind (e.g., the +Z direction) of the electronic device 101. According to an embodiment, at least a portion of the camera module 212 may be exposed to the outside of the electronic device 101 through the second opening 282 formed in the rear plate 280.

The electronic device 101 disclosed in FIGS. 2 to 4 has a bar-type or plate-type appearance but the disclosure is not limited thereto. For example, the illustrated electronic device may be a rollable electronic device or a foldable electronic device. The term "rollable electronic device" may mean an electronic device at least a portion of which may be wound or rolled or received in a housing (e.g., the housing 210 of FIG. 2) as the display (e.g., the display 230 of FIG. 4) may be bent and deformed. As the display is stretched out or is exposed to the outside in a larger area according to the user's need, the rollable electronic device may use an expanded second display area. "Foldable electronic device" may mean an electronic device that may be folded in directions to face two different areas of the display or in directions opposite to each other. In general, in the portable state, the foldable electronic device may be folded so that the two different areas of the display face each other and, in an actual use state, the user may unfold the display so that the two different areas form a substantially flat shape. In some embodiments, according to certain embodiments of the disclosure, the electronic device 101 may be interpreted as including various electronic devices, such as a laptop computer or a camera, as well as a portable electronic device, such as a smart phone.

It is noted that while the housing 210 protects internal electronic components from moisture or water, the housing 210 also includes an air gap 312, a vent 400 and a waterproofing member 600 as will be described in FIG. 6. The air gap 312, vent 400, and waterproofing member 600 allow air flow, thereby allowing the electronic device 101 to equalize the pressure.

Figure 5:
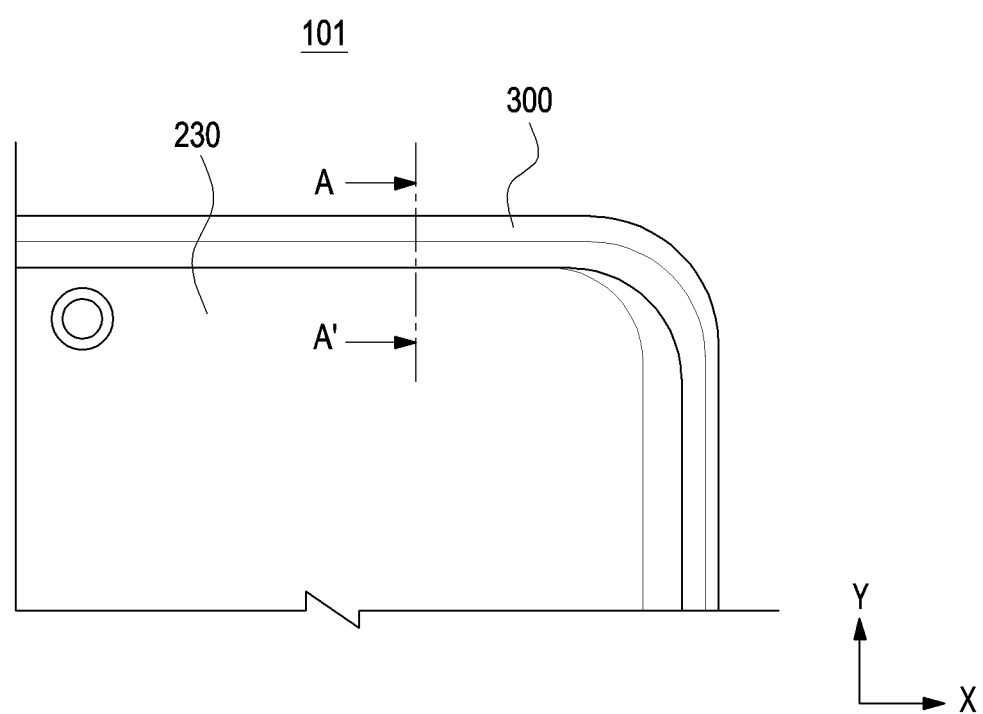
FIG. 5 is a front view illustrating an electronic device according to certain embodiments of the disclosure.

FIG. 5 is a front view illustrating an electronic device according to certain embodiments of the disclosure. FIG. 6 is a cross-sectional view taken along line A-A' of FIG. 5.

The housing includes a opening 312 that may include a first area 312a facing the inside (e.g., the display 230) of the electronic device 101 and a second area 312b facing the outside of the electronic device 101.

Supporting member 310 may include a first dent 316. The first dent 316 may receive at least a portion of the air vent 400. The air vent 400 may adjust the flow of gas or liquid. At least a portion of the air vent 400 may include a plurality of holes for blocking or reducing the flow of the liquid. The air vent 400 may be disposed between the housing 300 and the display 230. At least a portion (e.g., gas) of the fluid that has passed through the opening 312 may be transferred through the air vent 400 to the inside of the electronic device 101. According to an embodiment, an adhesive member 430 may include at least one of an optical clear adhesive (OCA), a pressure sensitive adhesive (PSA), a heat-reactive adhesive, a common adhesive, or a double-sided tape. Waterproofing member 600 may prevent or reduce penetration of an external foreign substance (e.g., moisture) into the electronic device 101. For example, the waterproofing member 600 may surround at least a portion of the air vent 400. The waterproofing member 600 may connect the display 230 and the housing 300. For example, the waterproofing member 600 may include a material having an adhesive property (e.g., a waterproof tape) and may couple the display 230 to the supporting member 310.

Figure 6:
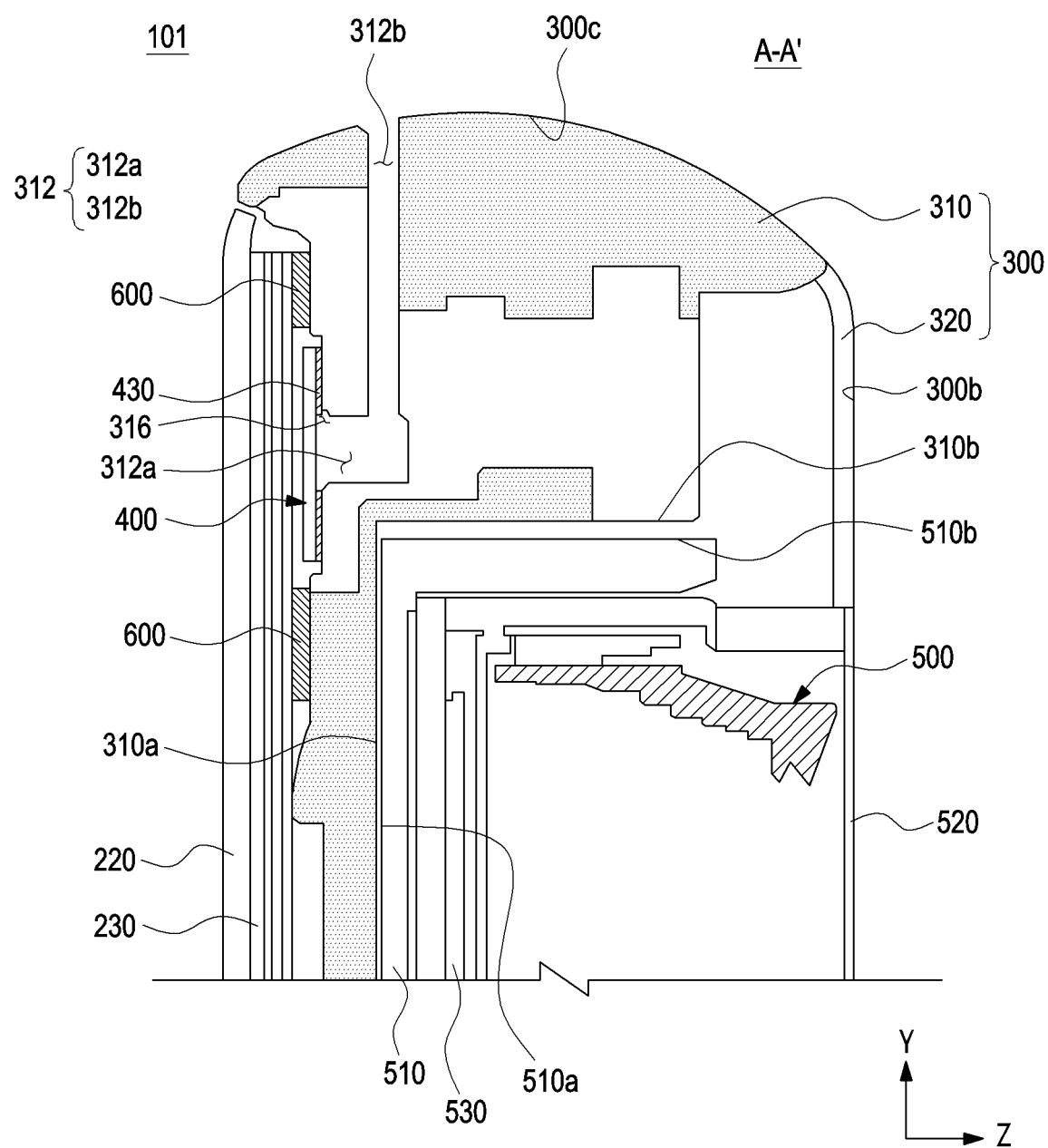
FIG. 6 is a cross-sectional view taken along line A-A' of FIG. 5.

Referring to FIGS. 5 and 6, an electronic device 101 may include a housing 300, a display 230, an air vent 400, and a camera module 500. The configuration of the housing 300, the front plate 220, the display 230, and the camera module 500 of FIG. 5 and/or FIG. 6 may be identical in whole or part to the configuration of the housing 210, the front plate 220, the display 230, and the camera module 212 of FIG. 2 and/or FIG. 3.

The housing 300 may form at least a portion of the exterior of the electronic device 101. For example, the housing 300 may include a supporting member 310, which forms at least a portion of the side surface 300c of the electronic device 101 or is disposed inside the housing 300 and connected with at least a portion of the side surface 300c, and a rear plate 320, which forms at least a portion of the rear surface 300b of the electronic device 101. The supporting member 310 may support the components of the electronic device 101. For example, the display 230 may be disposed on the supporting member 310. The rear plate 320 may be positioned in a direction opposite to the display 230 with respect to the supporting member 310. The configuration of the supporting member 310 may be identical in whole or part to the configuration of the first supporting member 232 and/or the second supporting member 260 of FIG. 4.

The supporting member 310 may include a opening 312 facing outward of the electronic device 101. The opening 312 may be a hole passing through the side surface 300c of the supporting member 310. The outside and inside of the electronic device 101 may be connected through the opening 312, and the pressure inside the electronic device 101 may be maintained substantially the same as the pressure outside the electronic device 101.

The opening 312 may include a first area 312a facing the inside (e.g., the display 230) of the electronic device 101 and a second area 312b facing the outside of the electronic device 101. The first area 312a and the second area 312b may be an integral empty space.

The supporting member 310 may include a first dent 316. The first dent 316 may be a dent or a recess formed in the supporting member 310 to face the display 230. The first dent 316 may extend from the first area 312a of the opening 312. The first dent 316 may receive at least a portion of the air vent 400.

According to certain embodiments, the rear plate 320 may surround at least a portion of the camera module 500. For example, the rear plate 320 may include a second opening (e.g., the second opening 282 of FIG. 4). The camera module 500 may be positioned in the second opening 282.

According to certain embodiments, the air vent 400 may adjust the flow of gas or liquid. According to an embodiment, at least a portion of the air vent 400 may include a plurality of holes for blocking or reducing the flow of the liquid. For example, at least a portion of the air vent 400 may be formed in a mesh shape.

According to certain embodiments, the air vent 400 may be disposed in the electronic device 101. The air vent 400 may be disposed between the housing 300 and the display 230. For example, the air vent 400 may be disposed on the supporting member 310 through an adhesive member 430. The air vent 400 may be positioned between the display 230 and the supporting member 310. The air vent 400 may face the opening 312. For example, at least a portion (e.g., gas) of the fluid that has passed through the opening 312 may be transferred through the air vent 400 to the inside of the electronic device 101. The adhesive member 430 may include at least one of an optical clear adhesive (OCA), a pressure sensitive adhesive (PSA), a heat-reactive adhesive, a common adhesive, or a double-sided tape.

According to certain embodiments, the camera module 500 may include a camera housing 510 for receiving a component (e.g., an image sensor 530 or a lens (not shown)) of the camera module 500 and forming at least a portion of the exterior of the camera module 500, a camera window 520 for protecting a lens (not shown), and an image sensor 530 capable of converting the light obtained using the camera module 500 into a digital signal. According to an embodiment, at least a portion of the camera module 500 may be disposed in the housing 300. For example, the camera housing 510 and/or the camera window 520 may be connected with the rear plate 320.

According to certain embodiments, at least a portion of the camera module 500 may be spaced apart from the supporting member 310. The camera housing 510 may include a first camera housing surface 510*a* facing the display 230 and a second camera housing surface 510*b* substantially perpendicular to the first camera housing surface 510*a*. The first camera housing surface 510*a* may be spaced apart from the first surface 310*a* of the supporting member 310, and the second camera housing surface 510*b* may be spaced apart from the second surface 310*b* of the supporting member 310. The air that has passed through the opening 312 and the air vent 400 may be transferred to the gap positioned between the supporting member 310 and the camera module 500.

According to certain embodiments, the electronic device 101 may include a waterproofing member 600. The waterproofing member 600 may prevent or reduce penetration of an external foreign substance (e.g., moisture) into the electronic device 101. For example, the waterproofing member 600 may surround at least a portion of the air vent 400. For example, the waterproofing member 600 may include at least one of a tape, an adhesive, waterproof dispensing, silicone, waterproof rubber, and urethane. The waterproofing member 600 may connect the display 230 and the housing 300. For example, the waterproofing member 600 may include a material having an adhesive property (e.g., a waterproof tape) and may couple the display 230 to the supporting member 310.

Figure 7:
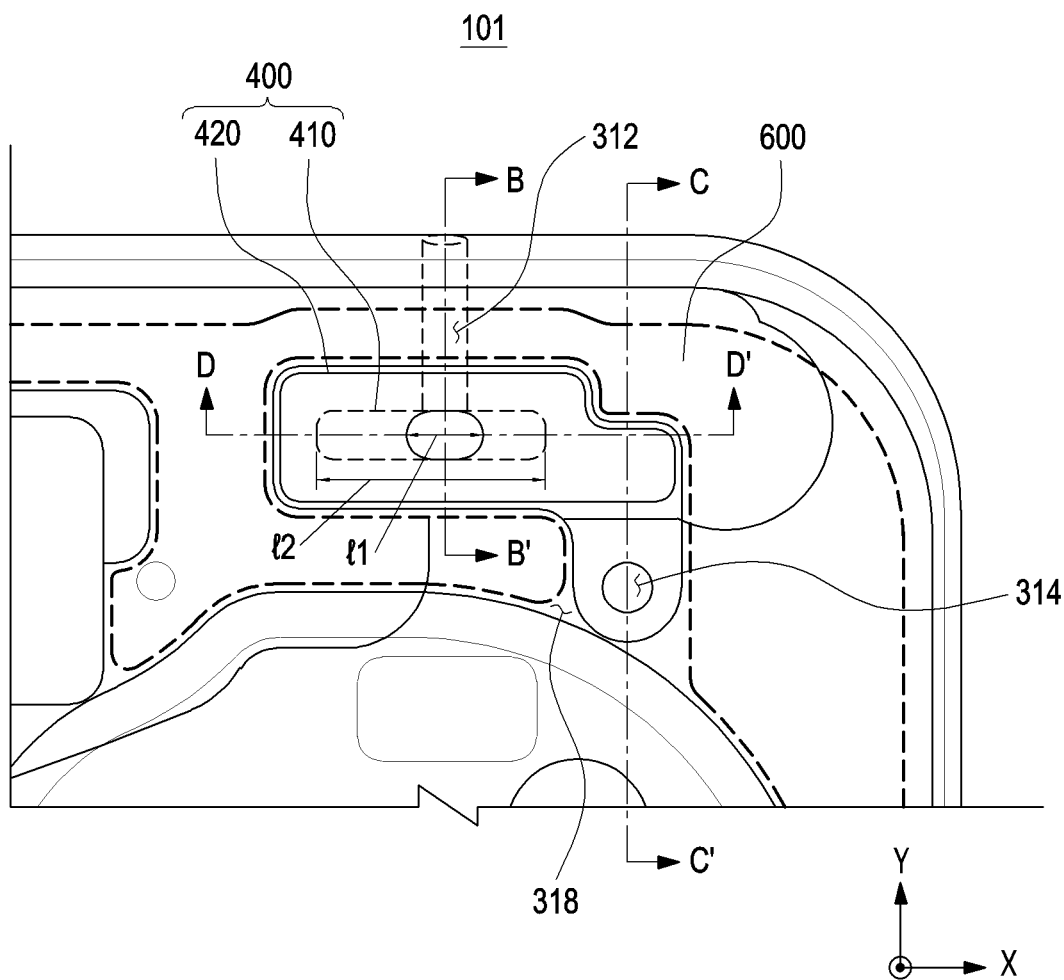
FIG. 7 is a front view illustrating an electronic device through which a display is shown, according to certain embodiments of the disclosure.
Figure 8:
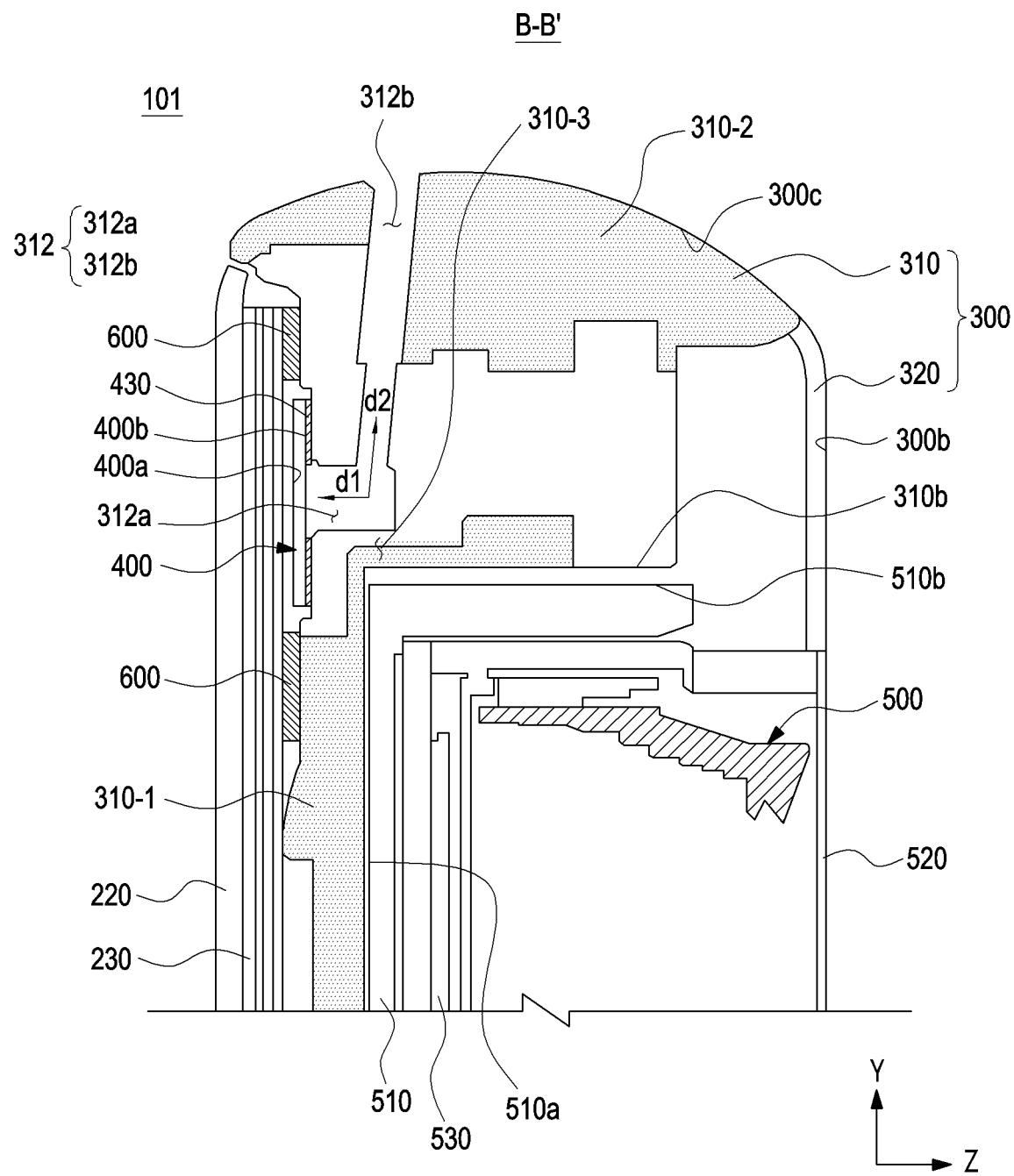
FIG. 8 is a cross-sectional view taken along line B-B' of FIG. 7.
Figure 9:
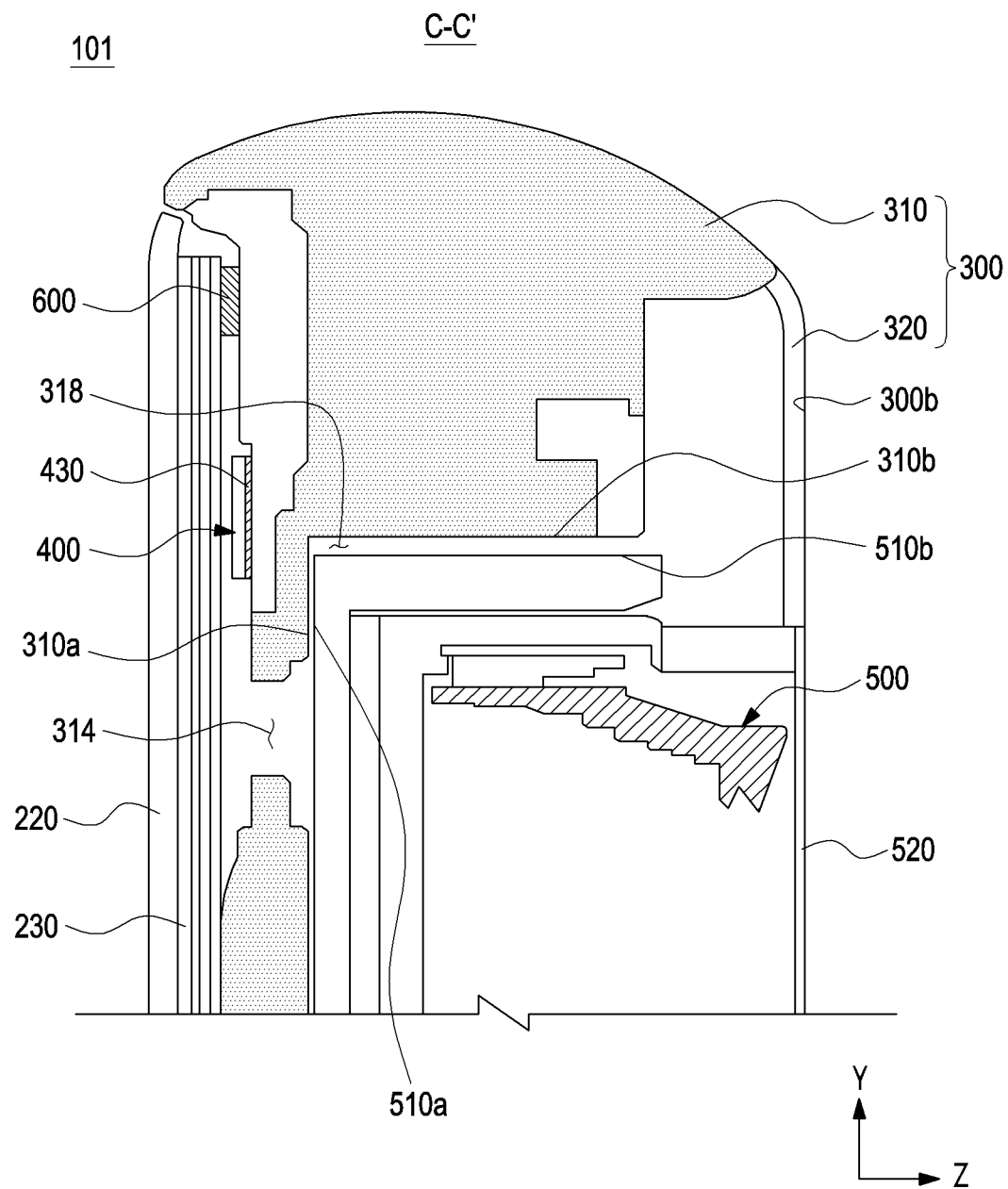
FIG. 9 is a cross-sectional view taken along line C-C' of FIG. 7.

In FIG. 7-9 an embodiment of the electronic device 101 is described with a cavity 314 that prevents condensation or fog from occurring at the camera window. The air vent 400 laterally extends to the rear of the camera module 500. A portion of the vent 400 is received by the cavity 314. The cavity 314 connected to a second dent 318 to the vicinity of the camera module 500.

FIG. 7 is a front view illustrating an electronic device through which a front plate and a display are shown, according to certain embodiments of the disclosure. FIG. 8 is a cross-sectional view taken along line B-B' of FIG. 7. FIG. 9 is a cross-sectional view taken along line C-C' of FIG. 7.

Referring to FIGS. 7 to 9, an electronic device 101 may include a housing 300, a display 230, an air vent 400, a camera module 500, and a waterproofing member 600. The configuration of the housing 300, the front plate 220, the display 230, the camera module 500, and the waterproofing member 600 of FIGS. 7 to 9 may be identical in whole or part to the configuration of the housing 300, the front plate 220, the display 230, the camera module 500, and the waterproofing member 600 of FIG. 6.

The supporting member 310 may be formed in a shape to reduce or prevent damage to the electronic device 101. The supporting member 310 may include a first supporting area 310-1 facing the display 230, a second supporting area 310-2 forming at least a portion of the side surface 300*c* of the housing 300, and a barrier rib 310-3 positioned between the first supporting area 310-1 and the second supporting area 310-2. The barrier rib 310-3 may be positioned between the opening 312 and the camera module 500. The barrier rib may reduce or prevent an external impact to the camera module 500 from outside of the electronic device 101 through the opening 312. For example, opening the barrier rib 310-3 may prevent direct contact between the external device and the camera module 500 if an external device (e.g., an ejector pin) is inserted into the opening 312. The first supporting area 310-1, the second supporting area 310-2, and the barrier rib 310-3 may be formed of an integral supporting member.

The opening 312 may be formed in a shape to reduce or prevent damage to the air vent 400. The opening 312 may include a first area 312*a* extending in a first direction d1 and a second area 312*b* extending from the first area 312*a* in a second direction d2 and facing outward of the electronic device 101. The first direction d1 may be substantially perpendicular, or within 10 degrees deviation, to the front surface (e.g., the front surface 210A of FIG. 2) of the housing 300 or the front plate 220, and the second direction d2 may be different from the first direction d1. For example, if an external device (e.g., an ejector pin) is inserted into the opening 312, the air vent 400 may not directly contact the external device. The angle x between the first direction d1 and the second direction d2 may be more than 90 degrees and less than 180 degrees.

The housing 300 may include a cavity 314. The supporting member 310 of the housing 300 may include the cavity 314 facing at least a portion of the camera module 500. The outside and inside of the electronic device 101 may be connected through the cavity 314, the air vent 400, and the opening 312. For example, the pressure applied to the camera module 500 may be substantially the same as the external pressure (e.g., atmospheric pressure) of the electronic device 101. Accordingly, dew condensation or fogging on the camera window 520 is reduced. The cavity 314 may be spaced apart from the opening 312. The size of the cross-sectional area of the opening 312 may be larger than the size of the cross-sectional area of the cavity 314.

The housing 300 may include a second dent 318. The second dent 318 may be a dent or recess formed in the supporting member 310 to face at least a portion of the camera module 500. The second dent 318, together with the opening 312, the air vent 400, and the cavity 314, may form an air path. The second dent 318 may extend from the cavity 314. The air that has passed through the opening 312, the air vent 400, and the cavity 314 may be transferred through the second dent 318 to the inside of the electronic device 101. According to an embodiment (not shown), the second dent 318 may be omitted. For example, the air introduced through the opening 312 and the air vent 400 may be transferred to the inside of the electronic device 101 along the waterproofing member 600.

According to certain embodiments, the air vent 400 may include a mesh area 410, at least a portion thereof faces the opening 312, and an edge area 420 facing the housing 300 and surrounding the mesh area 410. The mesh area 410 may be formed of a Teflon-based resin (e.g., Gore-Tex), a waterproof nonwoven fabric, and/or a membrane material. Gas may pass through the mesh area 410, and liquids or solids may not pass through the mesh area 410. The edge area 420 may be connected with the adhesive member 430 and may fix the air vent 400 to the supporting member 310. The air vent 400 may have a plate shape. For example, the air vent 400 may include a first air vent surface 400a facing the display 230 and a second air vent surface 400b facing the supporting member 310.

Figure 10:
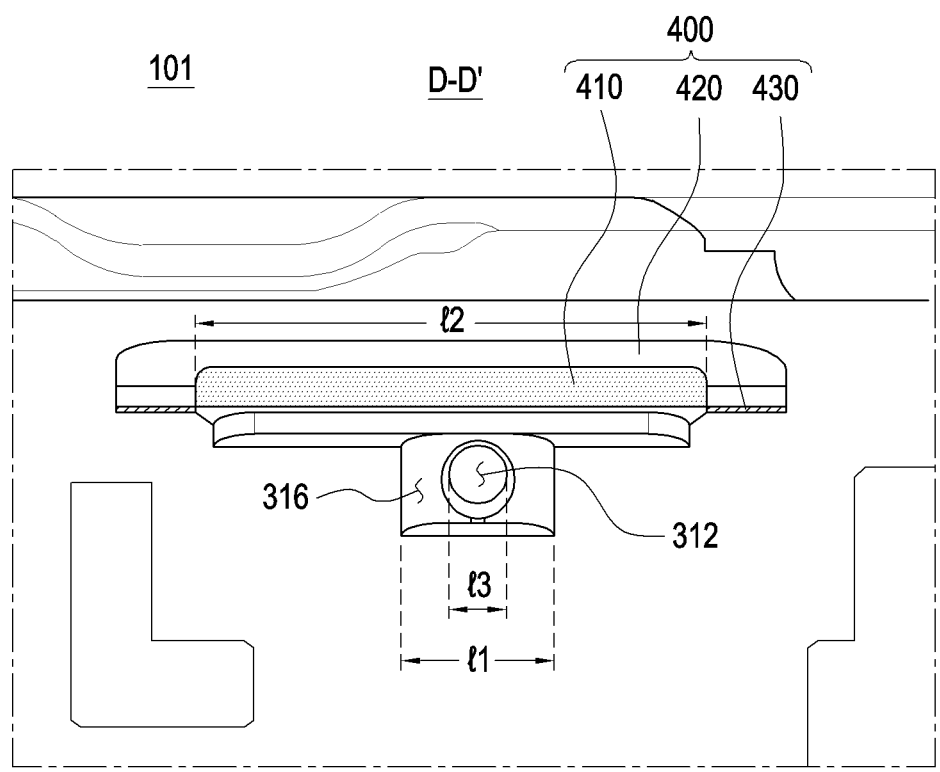
FIG. 10 is a perspective cross-sectional view taken along line D-D' of FIG. 7.

FIG. 10 is a perspective cross-sectional view taken along line D-D' of FIG. 7.

Referring to FIG. 10, an electronic device 101 may include a housing 300 including a opening 312 and an air vent 400 positioned to correspond to the opening 312. The configuration of the electronic device 101, the housing 300, and the air vent 400 of FIG. 10 may be identical in whole or part to the configuration of the electronic device, the housing 300, and the air vent 400 of FIG. 6.

According to certain embodiments, the opening 312, the first dent 316, and the air vent 400 of the housing 300 may guide the flow of air. For example, the air inside the electronic device 101 may be transferred to the outside of the electronic device 101 in the order of the air vent 400, the first dent 316, and the opening 312. To increase the flow of air, the size of the cross-sectional area of the first dent 316 or the size of the cross-sectional area of the air vent 400 may be larger than the size of the cross-sectional area of the opening 312. For example, the first length 11 that is the length of the cross section of the first dent 316 or the second length 12 that is the length of the cross section of the mesh area 410 is larger than the third length 13 that is the length of the cross section of the opening 312. In the electronic device 101 in which the size of the cross-sectional area of the first dent 316 or the size of the cross-sectional area of the air vent 400 is larger than the size of the cross-sectional area of the opening 312, an air flow rate may be increased, and adjustment of pressure (e.g., pressure equilibrium) may be enhanced.

The amount of moisture accumulated in the electronic device 101 may be reduced by the first dent 316 of the housing 300. For example, the first dent 316 may be formed to face the outside of the electronic device 101, and the moisture introduced through the opening 312 may be received in the first dent 316. The ingress of the introduced moisture into the inside of the electronic device 101 may be prevented or reduced by the mesh area 410 of the air vent 400 and may be positioned in the opening 312 and/or the first dent 316. The opening 312 and/or the first dent 316 may be formed in a structure to reduce the amount of moisture flowing into the electronic device 101. For example, the first dent 316 and the opening 312 may be formed in a shape to reduce or minimize the volume of the empty space between the air vent 400 and the space outside the electronic device 101. The size of the cross-sectional area of the first dent 316 may be smaller than the size of the cross-sectional area of a portion (e.g., the mesh area 410) of the air vent 400. For example, the first length 11 that is the length of the cross section of the first dent 316 may be smaller than the second length 12 that is the length of the cross section of the mesh area 410. The size of the cross-sectional area of a portion (e.g., the area connected with the opening 312) of the first dent 316 may be smaller than the size of the cross-sectional area of another portion (e.g., the mesh area 410) of the first dent 316.

According to certain embodiments of the disclosure, an electronic device (e.g., the electronic device 101 of FIG. 2) may comprise a housing including a opening (e.g., the opening 312 of FIG. 6) facing an outside of the electronic device and a cavity (e.g., the cavity 314 of FIG. 9) spaced apart from the opening, a display (e.g., the display 230 of FIG. 4) disposed on the housing, an air vent (e.g., the air vent 400 of FIG. 6) disposed between the housing and the display and at least partially facing the opening, and a camera module (e.g., the camera module 500 of FIG. 6) disposed in the housing and at least partially facing the cavity.

According to certain embodiments, the air vent may include a mesh area (e.g., the mesh area 410 of FIG. 7) facing the opening and an edge area (e.g., the edge area 420 of FIG. 7) surrounding the mesh area and facing the housing.

According to certain embodiments, the electronic device may further comprise a waterproofing member (e.g., the waterproofing member 600 of FIG. 6) connecting the display with the housing and surrounding at least a portion of the air vent.

According to certain embodiments, the opening may include a first area (e.g., the first area 312a of FIG. 8) facing the display and extending in a first direction (e.g., the first direction d1 of FIG. 8) and a second area (e.g., the second area 312b of FIG. 8) extending from the first area in a second direction (e.g., the second direction d2 of FIG. 8) different from the first direction and facing the outside of the electronic device.

According to certain embodiments, the housing may include a first dent (e.g., the first dent 316 of FIG. 6) extending from the first area and receiving at least a portion of the air vent.

According to certain embodiments, a size of a cross-sectional area of the air vent may be larger than a size of a cross-sectional area of the first dent, and the size of the cross-sectional area of the first dent may be larger than a size of a cross-sectional area of the opening.

According to certain embodiments, the opening may be formed to pass through a side surface (e.g., the side surface 300c of FIG. 6) of the housing.

According to certain embodiments, the housing may include a second dent (e.g., the second dent 318 of FIG. 7) extending from the cavity and facing at least a portion of the camera module.

According to certain embodiments, the housing may include a supporting member (e.g., the supporting member 310 of FIG. 6) including the opening and the cavity and a rear plate (e.g., the rear plate 320 of FIG. 6) surrounding the camera module.

According to certain embodiments, the air vent may be positioned between the display and the supporting member.

According to certain embodiments, the camera module may include a camera window (e.g., the camera window 520 of FIG. 6) connected with the rear plate, an image sensor (e.g., the image sensor 530 of FIG. 6) disposed in the camera housing, and a camera housing (e.g., the camera housing 510 of FIG. 6) receiving the image sensor.

According to certain embodiments, the camera housing may include a first camera housing surface (e.g., the first camera housing surface 510*a* of FIG. 6) facing the display and a second camera housing surface (e.g., the second camera housing surface 510*b* of FIG. 6) substantially perpendicular to the first camera housing surface. The supporting member may include a first surface (e.g., the first surface 310*a* of FIG. 6) facing the first camera housing surface and a second surface (e.g., the second surface 310*b* of FIG. 6) facing the second camera housing surface. The first camera housing surface and the first surface may be spaced apart from each other, and the second camera housing surface and the second surface may be spaced apart from each other.

According to certain embodiments, the rear plate may include a second opening (e.g., the second opening 282 of FIG. 4) surrounding at least a portion of the camera module.

According to certain embodiments, the air vent may include a first air vent surface (e.g., the first air vent surface 400*a* of FIG. 8) facing the display and a second air vent surface (e.g., the second air vent surface 400*b* of FIG. 8) facing the housing.

According to certain embodiments, the supporting member may include a first supporting area (e.g., the first supporting area 310-1 of FIG. 8) facing the display, a second supporting area (e.g., the second supporting area 310-2 of FIG. 8) forming a side surface (e.g., the side surface 300*c* of FIG. 8) of the housing, and a barrier rib (e.g., the barrier rib 310-3 of FIG. 8) positioned between the first supporting area and the second supporting area.

According to certain embodiments of the disclosure, an electronic device (e.g., the electronic device 101 of FIG. 2) may comprise a housing (e.g., the housing 300 of FIG. 6) including a supporting member (e.g., the supporting member 310 of FIG. 6) including a opening (e.g., the opening 312 of FIG. 6) facing an outside of the electronic device and a cavity (e.g., the cavity 314 of FIG. 7) spaced apart from the opening and a rear plate (e.g., the rear plate 280 of FIG. 4) connected with the supporting member and including a second opening (e.g., the second opening 282 of FIG. 4), a display (e.g., the display 230 of FIG. 6) disposed on the supporting member, an air vent (e.g., the air vent 400 of FIG. 6) disposed between the supporting member and the display and at least partially facing the opening, and a camera module (e.g., the camera module 500 of FIG. 6) disposed in the housing, facing the cavity, and at least partially exposed to the outside of the electronic device through the second opening.

According to certain embodiments, the air vent may include a mesh area (e.g., the mesh area 410 of FIG. 7) facing the opening and an edge area (e.g., the edge area 420 of FIG. 7) surrounding the mesh area and facing the housing.

According to certain embodiments, the electronic device may further comprise a waterproofing member (e.g., the waterproofing member 600 of FIG. 6) connecting the display with the housing and surrounding at least a portion of the air vent.

According to certain embodiments, the opening may include a first area (e.g., the first area 312*a* of FIG. 8) facing the display and extending in a first direction (e.g., the first direction d1 of FIG. 8) and a second area (e.g., the second area 312*b* of FIG. 8) extending from the first area in a second direction (e.g., the second direction d2 of FIG. 8) different from the first direction and facing the outside of the electronic device.

According to certain embodiments, the housing may include a first dent (e.g., the first dent 316 of FIG. 6) extending from the first area and receiving the air vent. The size of the cross-sectional area of the air vent may be larger than the size of the cross-sectional area of the first dent, and the size of the cross-sectional area of the first dent may be larger than the size of the cross-sectional area of the opening.

According to certain embodiments, an electronic device 101 comprises: a housing 300 having an opening 312, wherein the opening extending from outside the electronic device to the inside of the electronic device; an air vent 400 in the housing receiving at least a portion of the opening on the inside of the electronic device; a waterproofing member 600 in the housing connecting a display 230 to the housing 300, the waterproofing member 600 at least partially surrounding the air vent 400; a cavity 314 in the housing spaced apart from the opening 312, the cavity 314 received by the air vent 400; a camera module in the housing, and wherein the cavity 314 forms portion of an airway from the camera module 500 to the opening 312.

According to certain embodiments, the opening 312 includes a second area facing the outside of the electronic device, and a first area substantially perpendicular to the second area and facing the display.

According to certain embodiments, the air vent 400 includes a mesh area facing the opening and an edge area surrounding the mesh area and facing the housing.

According to certain embodiments, the air vent 400 includes a first air vent surface facing the display and a second air vent surface facing the housing.

According to certain embodiments, the housing 300 includes a dent 318 extending from the cavity and facing at least a portion of the camera module.

It is apparent to one of ordinary skill in the art that an electronic device including an air vent according to the disclosure are not limited to the above-described embodiments and those shown in the drawings, and various changes, modifications, or alterations may be made thereto without departing from the scope of the present invention.

The invention claimed is:

1. An electronic device comprising,
 a housing including a supporting member, a display disposed thereon, and an opening having a first area facing the display and extending in a first direction and a second area extending from the first area in a second direction different from the first direction and facing outside of the electronic device, wherein the supporting member includes a cavity spaced apart from the opening;
 an air vent disposed between the supporting member of the housing and the display, wherein one end of the opening faces an outside of the electronic device and the other end of the opening at least partially faces the air vent; and
 a camera module disposed in the housing and at least partially facing the cavity, wherein the cavity preventing condensation or fog from occurring at a window of the camera module,
 wherein at least a portion of the camera module is spaced apart from the supporting member and forms a gap positioned between the camera module and the supporting member,
 wherein the air vent laterally extends to a rear of the camera module and a portion of the air vent is received by the cavity connected to the gap, and
 wherein the gap, the air vent and the opening are configured to provide an air path from the camera module to the outside of the electronic device.

2. The electronic device of claim 1, wherein the air vent includes a mesh area facing the opening and an edge area surrounding the mesh area and facing the housing.

3. The electronic device of claim 1, further comprising a waterproofing member connecting the display with the housing and at least partially surrounding the air vent.

4. The electronic device of claim 1, wherein the housing includes a first dent extending from the first area and receiving at least a portion of the air vent.

5. The electronic device of claim 4, wherein a size of a cross-sectional area of the air vent is larger than a size of a cross-sectional area of the first dent, and the size of the cross-sectional area of the first dent is larger than a size of a cross-sectional area of the opening.

6. The electronic device of claim 1, wherein the opening is formed to pass through a side surface of the housing.

7. The electronic device of claim 1, wherein the housing includes a second dent extending from the cavity and facing at least a portion of the camera module.

8. The electronic device of claim 1, wherein the housing further includes a rear plate surrounding the camera module.

9. The electronic device of claim 8, wherein the air vent is positioned between the display and the supporting member.

10. The electronic device of claim 8, wherein the camera module includes,
   an image sensor, a camera window connected with the rear plate, and
   a camera housing receiving the image sensor.

11. The electronic device of claim 10, wherein
   the camera housing includes a first camera housing surface facing the display and a second camera housing surface substantially perpendicular to the first camera housing surface, wherein
   the supporting member includes a first surface facing the first camera housing surface and a second surface facing the second camera housing surface, and wherein
   the first camera housing surface and the first surface are spaced apart from each other, and the second camera housing surface and the second surface are spaced apart from each other.

12. The electronic device of claim 8, wherein the rear plate includes a second opening surrounding at least a portion of the camera module.

13. The electronic device of claim 8, wherein the supporting member includes a first supporting area facing the display, a second supporting area forming a side surface of the housing, and a barrier rib positioned between the first supporting area and the second supporting area.

14. The electronic device of claim 1, wherein the air vent includes a first air vent surface facing the display and a second air vent surface facing the housing.

15. An electronic device comprising:
   a housing having a display, a supporting member, and an opening, wherein the opening includes a first area facing the display and a second area substantially perpendicular to the first area and extending from outside the electronic device to inside of the electronic device;
   an air vent disposed on the first area of the opening in the housing;
   a waterproofing member in the housing connecting a display to the housing, the waterproofing member at least partially surrounding the air vent;
   a cavity in the supporting member of the housing spaced apart from the opening, the cavity received by the air vent; and
   a camera module in the housing,
   wherein at least a portion of the camera module is spaced apart from the supporting member and forms a gap positioned between the camera module and the supporting member, and
   wherein the gap, the cavity, the air vent and the opening are configured to provide an airway from the camera module to the outside of the electronic device.

16. The electronic device of claim 15, wherein the air vent includes a mesh area facing the opening and an edge area surrounding the mesh area and facing the housing.

17. The electronic device of claim 15, wherein the air vent includes a first air vent surface facing the display and a second air vent surface facing the housing.

18. The electronic device of claim 15, wherein the housing includes a second dent extending from the cavity and facing at least a portion of the camera module.

* * * * *